(12) United States Patent
Nakata

(10) Patent No.: US 6,262,436 B1
(45) Date of Patent: Jul. 17, 2001

(54) SEMICONDUCTOR DEVICE AND METHOD OF MAKING THE SAME

(75) Inventor: Shinichi Nakata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/185,640

(22) Filed: Nov. 4, 1998

(30) Foreign Application Priority Data

Nov. 5, 1997 (JP) .................................................. 9-302579

(51) Int. Cl.$^7$ ...................................................... H01L 29/04
(52) U.S. Cl. ................................................. 257/59; 257/72
(58) Field of Search .............................. 257/59, 72, 347, 257/435, 659

(56) References Cited

U.S. PATENT DOCUMENTS 6,057,904 * 5/2000 Kim et al. ............................... 257/59

* cited by examiner

Primary Examiner—Mark V. Prenty
(74) Attorney, Agent, or Firm—Sughrue, Mion, Zinn, Macpeak & Seas, PLLC

(57) ABSTRACT

A semiconductor device suitable for use in a flat display LCD according to an active matrix display type device comprising a-Si thin film transistor (TFT) elements is provided. The TFT which is a forward stagger type transistor is produced by, forming a light shielding film 2 and, after forming a source electrode 5, a drain electrode and a drain signal line 6a, and gate electrode 10 and a gate signal line 10a, the light shielding film 2 is removed excluding the area covered by those electrode and signal lines. The number of manufacturing steps of this type of TFT is reduced by this manufacturing method which results in a reduction in the manufacturing cost. Furthermore, the TFT manufactured by this method is provided with a higher aperture which improves its operating performance.

7 Claims, 4 Drawing Sheets

SEMICONDUCTOR DEVICE AND METHOD OF MAKING THE SAME

BACKGROUND OF THE INVENTION

1. Field of the Invention

The present invention relates to an LCD (liquid crystal device) operated by thin film transistors as active matrix switching elements, and particularly relates to a semiconductor device for a flat liquid crystal display and method of making the same.

This application is based on Patent Application No. Hei 9-302579 filed in Japan, the content of which is incorporated herein by reference.

2. Background Art

Recently, thin film transistors (TFT) are being widely used as active switching elements for driving liquid crystal flat display devices. Among those thin film transistors, a forward stagger type configuration, in which a gate electrode is mounted on the upper side of a channel layer, and source and drain electrodes are mounted in the lower side, is advantageously used because of its simple structure, and reduced number of lithographic steps in manufacturing, and such that the manufacturing cost is low.

An example of the representative forward stagger type TFT is shown in FIG. 5. The TFT is provided with, on an insulating substrate such as a glass plate, a metallic light shielding film 3, a transparent interlayer insulating film 4, a pixel electrode 12, a source electrode 5, a drain electrode 6, an n+ amorphous silicon layer 7, an amorphous silicon layer 8, a gate insulating film 9, a gate electrode 10; and the TFT is covered and protected by a protective insulation film 13. The source electrode 5 and drain electrode 6 are formed on a pixel electrode 12 and a residual layer 14 made of the same material as that of the pixel electrode, and the drain electrode 6 is connected to the pixel electrode 12 through the residual layer 14.

A practical example of an active matrix panel is disclosed in Japanese Patent Application, First Publication No. Hei 7-239481, in which, as shown in FIG. 5, an n+ amorphous silicon 7 is separated into the source electrode 5 side and the drain electrode 6 side.

In this forward stagger type TFT, it is necessary to provide a formation process of a light shielding film, in order to suppress the leak current caused by the light admittance to the amorphous silicon layer 8.

In contrast, in a TFT disclosed in Japanese Patent Application, First Publication No. Hei 9-92618, a black matrix normally formed by a Cr film at the color filter side is mounted at the TFT substrate side, concurrently with the formation of the light shielding film.

Japanese Patent Application, First Publication No. Hei 5-210119 has proposed an active matrix liquid crystal display screen, in which the black matrix and the color filter are formed under the forward type stagger TFT, concurrently with the formation of the light shielding layer.

In the conventional forward stagger type TFT, a photolithographic process is needed for forming the light shielding film, so that, it is difficult to reduce the number of manufacturing processes, and it is not advantageous to adopt such TFT for flat type display devices for which cost reduction is required.

As disclosed in the above mentioned prior art references, when the black matrix is formed at the color filter side, it is necessary to precisely align the black matrix with the TFT substrate, that is, the black matrix must be overlapped accurately with the TFT substrate. For this reason, it is necessary but difficult to increase a so-called aperture which corresponds to expanding the area of the pixel electrode.

It is therefore an object of the present invention to provide a semiconductor device and a method of manufacturing the same, which is particularly suitable for a flat display LCD operated by an active matrix display principle using the a-SiTFT, and which has an increasing aperture, and a reduced manufacturing cost by reduction of the number of manufacturing processes.

SUMMARY OF THE INVENTION

A semiconductor device of the present invention is provided with a source electrode and a drain electrode on an insulating film formed on a surface of an insulating substrate, and an amorphous silicon (a-Si), a gate insulating layer, and a gate electrode are formed in this order on the insulating film so as to cover at least a part of the source and drain electrodes. Subsequently, the drain electrode of the semiconductor device is connected to a pixel electrode to construct a forward stagger type thin film transistor element (TFT). The insulating film has a light shielding property, and the light shielding film on the transparent substrate is removed excluding the area covered by the source electrode, the drain electrode and the drain signal line, and the gate electrode and the gate signal lines.

In this structure, the light shielding film may be formed by combining two film layers laminating a light shielding organic film with an insulating inorganic film.

The semiconductor device of the present invention is suitable for color liquid crystal display devices driven by a-SiTFTs and active matrix display systems driven by a-SiTFTs.

This color liquid display devices can be used as liquid crystal flat display devices by forming a transparent smoothening film so as to cover the substrate region where the light shielding film is removed.

Furthermore, in the present invention, the insulating film with a light shielding property can mask wiring of the source electrode, the drain electrodes and the drain signal line, and the gate electrode and the gate signal line, and removes all of the light shielding insulating layer except areas covered by those electrodes and signal lines.

In this case, the region where the light shielding insulating film is removed is covered by forming a transparent, smoothening film for smoothening such substrate region. When this device is used for an active matrix type display device in which respective a-SiTFTs are connected to each pixel electrode, said pixel electrode is formed so as to overlap at least either one of the drain signal line or the gate signal line, and is connected to the drain electrode through a contact hole formed through the transparent smoothening film.

Consequently, as shown above, since the light shielding film is selected from a material which can be etched by an etching gas simultaneously during the etching process of the TFT, the conventional process for forming the light shielding film can be eliminated. This is realized by using gases with a selective etching property which are not capable of etching wiring materials and the gate insulating film, but are capable of etching the amorphous silicon film and the light insulating film.

DESCRIPTION OF PREFERRED EMBODIMENTS

As an embodiment of the semiconductor device of the present invention, a color LCD of a liquid flat display panel according to an a-SiTFT active matrix display system and a method of manufacturing the same will be described hereinafter, referring to the attached drawings.

Figure 1:
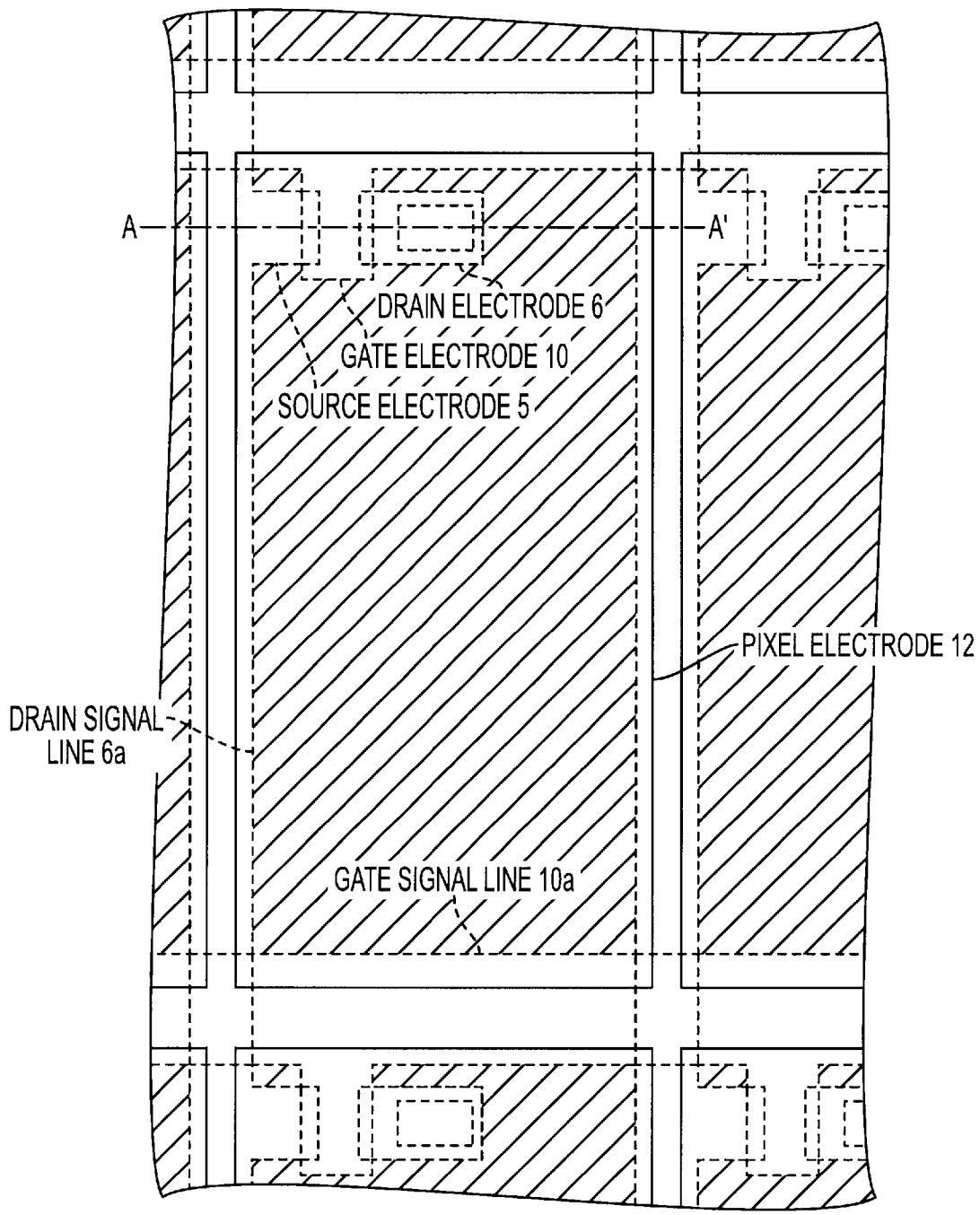
FIG. 1 shows a plan view of a one pixel region of a p-SiTFT active matrix LCD which is an embodiment of the present invention.
Figure 2:
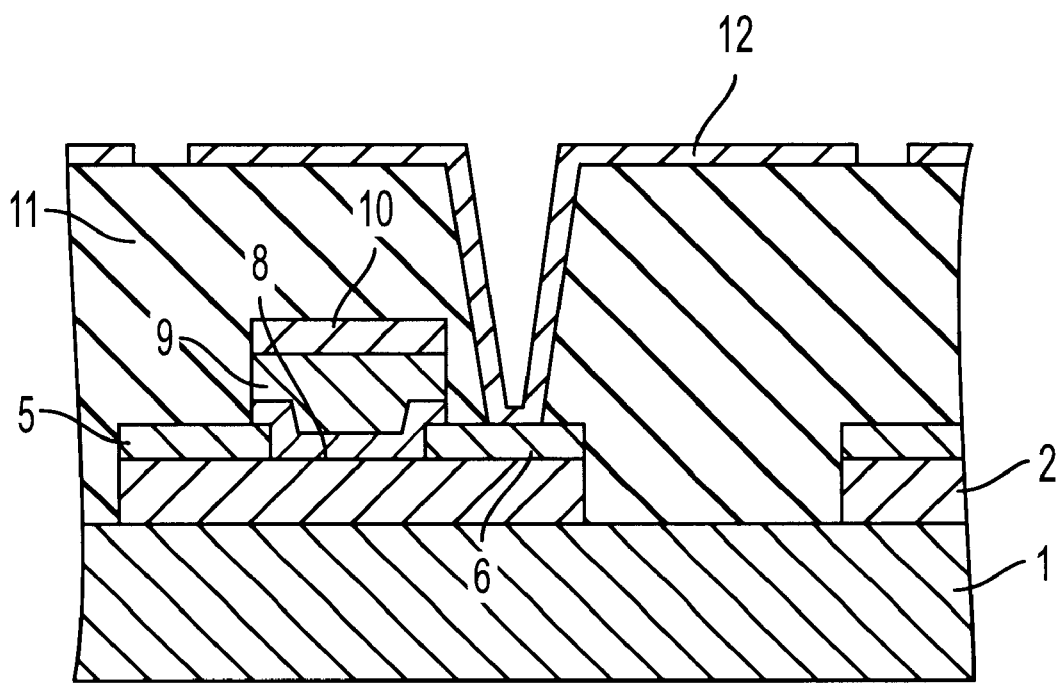
FIG. 2 shows a cross-sectional view sectioned along the A—A line of FIG. 1.

FIG. 1 shows a plan view of one pixel region of a TFT as an active switching element for active matrix display system, and FIG. 2 shows a cross section along the line A—A in FIG. 1. In the most preferable embodiment, a light shielding insulating film 2 is etched excluding a region for masking a source electrode 5, a drain electrode 6 and a drain signal electrode 6a, a gate electrode 10 and a gate signal electrode 10a.

As shown in FIG. 2, a light shielding insulating film 2 is formed using a light shielding organic material on an insulating substrate 1. Examples of the organic materials for forming the organic light shielding film are acrylic resin, polyimide, a mixture of a light curable resin with a black pigment or carbon black. Since this light shielding insulating film 2 improves a blocking effect for back channels, it is possible to form a double layer by combining the above organic layer with an inorganic layer by coating thereon (refer to Example 2, FIG. 4). In this case, a silicon oxide film or a silicon nitride film can be used as an inorganic film.

On the light shielding film 2, the source electrode 5 and the drain electrode 6 are made by a pattern formation of a conductive film. The conductive film may be formed by a transparent conductive film of ITO (Indium Tin Oxide), or a metal film such as Mo (Molybdenum) or Cr (Chromium). When Mo film is used, it is necessary to provide a barrier metal for preventing etching by fluorine gas.

An amorphous silicon (a-Si) 8 and the gate insulating film 9 formed on the source electrode 5 and the drain electrode 6 is, after etching the gate electrode 10, formed by patterning using the gate electrode as a mask. The gate insulating film is formed by a material such as a silicon oxide film or a silicon nitride film. The gate electrode is formed by a metal such as Al, Mo, and Cr.

In order to cover, and protect the above mentioned electrodes, and smoothen the device which is one of the features of the present invention, a transparent smoothening film 11 is formed by a material such as a positive type photo-sensitive acrylic resin or a non-photosensitive cardo, BCB (Benzocyclobutene) or a siloxane-type fluorine-containing resin. When a photosensitive resin is used, a contact hole can be made at the same time as the development. When a non-photosensitive resin is used, it is necessary to form a hole using a dry-etching apparatus after the resin is fully cured. After the contact hole is formed, pixel electrodes 12 are formed at the upper layer using a transparent conductive film such as ITO.

First Embodiment

As shown in FIGS. 1 and 2, each pixel is located in and on a crossing region of two gate signal lines 10a adjacent to each other and two drain signal lines 6a adjacent to each other. The pixel electrode overlaps on an end of the gate signal line 10a and an end of the drain signal line 6a by as much as 1 to 1.5 μm. Furthermore, the pixel electrode is connected to the drain electrode 6 through a contact hole opened in the transparent smoothening film.

In FIGS. 1 and 2, each pixel is located in and on an intersection area of the two gate signal lines adjacent to each other and two gate signal lines adjacent to each other. The pixel electrode overlaps the gate signal lines 10a and the drain signal lines 6a at the ends of these lines by as much as 1 to 1.5 μm. And each pixel electrode is connected to the drain electrode 6 through a hole opened in the smoothened transparent film.

FIGS. 3A to 3F show manufacturing steps of this type of a-SiTFT.

First, a light shielding film 2 is coated on a glass substrate 1 by a spin coating apparatus. If a slit coating apparatus is applied, it is advantageous to reduce the quantity of the material used for coating the light shielding film 2 by a half of that of the case of the spin coating. The light shielding film is formed by, for example, a pigment dispersion type acrylic resin which is made by dispersing a black pigment in an acrylic resin. It is possible to use as the material for the light shielding film a photo-curing resin or a polyimide resin with additives of carbon black or a black pigment. The properties of this light shielding film 2 is 3.0 in the dielectric constant and 0.001% in light transmittance (at a film thickness of 1.0 μm, and at a wavelength of 400 nm). The thickness of the light shielding film is preferably as thin as possible, from the point of view of etching property in a later process, and a film thickness of less than 1 μm or less is preferable. The film thickness is controllable by the revolution of the base plate of the spin coating. When a pigment dispersion type acrylic resin is used, a light shielding film with a thickness of 0.7 μm is obtained by setting the revolution of the spin coating base plate at 550 rpm for 30 minutes. After the coating, the resin is fully cured in a heating furnace at 250° C. for 60 min. under flowing nitrogen.

Figure 3A:
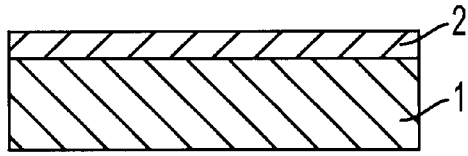
FIGS. 3(a) to 3(f) are cross sectional views showing the manufacture process according to one embodiment of the present invention.
Figure 3D:
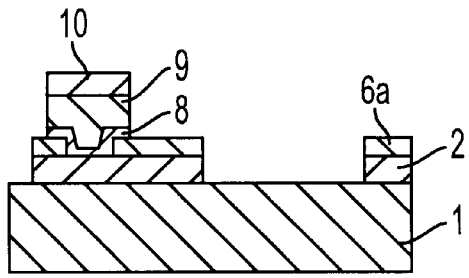
Figure 3B:
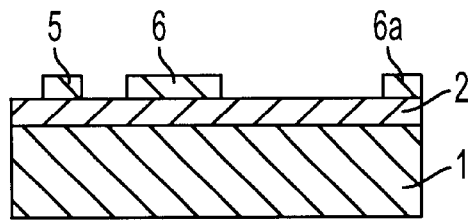

Subsequently, a Cr film with a thickness of 1500 Å is deposited by sputtering process and the source electrode 5, the gate electrode 6, and the drain signal line 6a are formed by using a photolithographic technique [FIG. 3B].

In order to enhance the bonding strength between the light shielding film 2 and the Cr film, the surface of the light shielding film is surface treated by an oxygen plasma, before the Cr film deposition. The surface treatment is executed by a dry-etching apparatus under the following conditions.

| | |
|---|---|
| Flow-rate of $O_2$: | 200 sccm |
| Distance between electrodes: | 100 mm |
| RF power: | 1200 W |
| Temperature: | 20° C. |
| Pressure: | 100 Pa |
| Treating time: | 30 sec. |

After the formation of the source electrode 5 and the drain electrode 6, a $PH_3$ plasma treatment is conducted for providing a ohmic layer by a PCVD apparatus, and successively an a-Si 8 film and a silicon nitride film are formed for the gate insulating film 9. The a-Si film 8 is formed at a thickness of 300 Å, and the thickness of the gate insulating film is 3000 Å. A gate electrode 10 is formed thereon by sputtering Al at a thickness of 2000 Å and by patterning. The etching for patterning is executed by a PHC solution (a mixture of phosphoric acid, nitric acid, and acetic acid) by a wet etching procedure.

Subsequently, the a-Si film 8, the gate insulating film 9, and the light shielding insulating film 2 are etched using $SF_6$ gas and $O_2$ gas. The metal material of Al which is used for the gate electrode 10 and the gate signal line 10a are not etchable by those $SF_6$ and $O_2$ gases. Thus, the region shown by diagonal lines are removed by etching, using those wired areas as a mask. The gas etching conditions are as follows.

| | |
|---|---|
| Flow rate of SF6: | 200 sccm |
| Distance between electrodes: | 100 mm |
| Flow rate of O2: | 40 sccm |
| RF power: | 1200 W |
| Pressure: | 10 Pa |
| Etching time: | 280 sec |

Figure 3E:
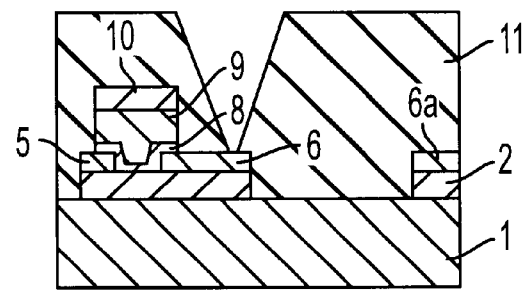
Figure 3C:
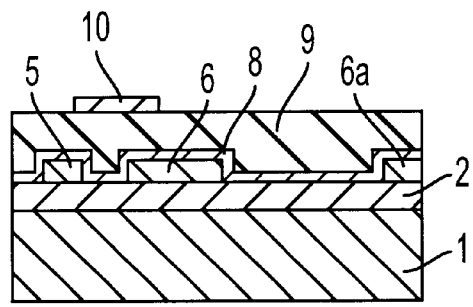

Subsequently, a transparent smoothening film 11 is formed thereon. The thickness of the film 11 is 2.5 μm, which is attained by making the dielectric constant 3.0, and which enable a reduction in the capacity between the wiring and the pixel electrode. Next, a contact hole is formed by successive steps of coating, for example, a photosensitive acrylic resin without containing a coloring agent, half curing, light exposure, and developing by a developer (0.4% TMAH, that is, tetramethylammoniumhydroxide). During this hole-forming process, the light exposure apparatus uses a light source of i-line type source to prevent a reduction in the transmittance of the transparent smoothening film (FIG. 3E).

Figure 3F:
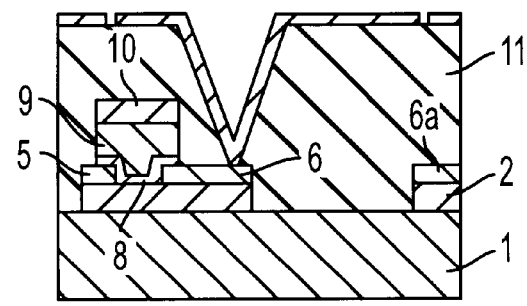

Subsequently, a pixel electrode 12 is formed by sputtering ITO (indium tin-oxide) and by subsequent patterning. It is necessary for the pixel electrode 12 to overlap with the other electrodes at least 1.5μm, respectively, from the accuracy of the exposure. The etching for patterning is executed by HCL gas using a dry etching apparatus. The thickness of the ITO film is set at 800 Å in consideration of the coverage of the contact hole (FIG. 3F).

Second Embodiment

Figure 4:
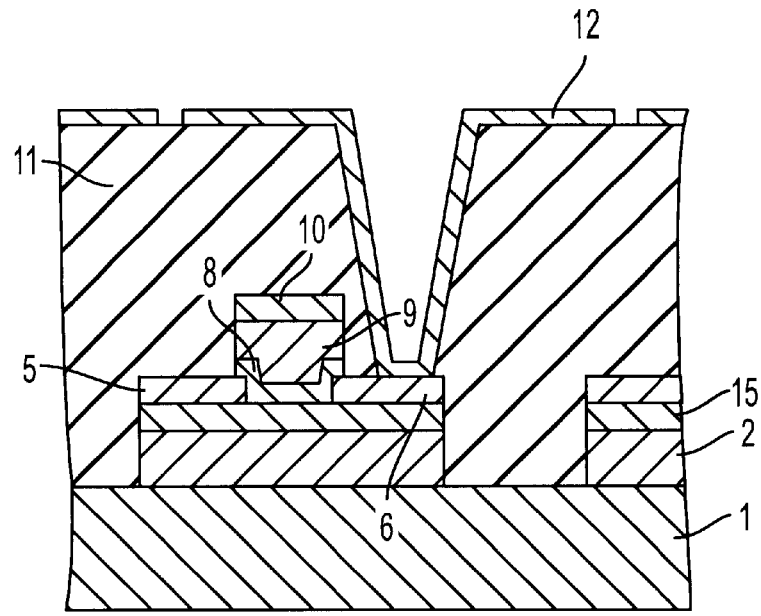
FIG. 4 shows a cross sectional view of a semiconductor device according to a second embodiment of the present invention.
Figure 5:
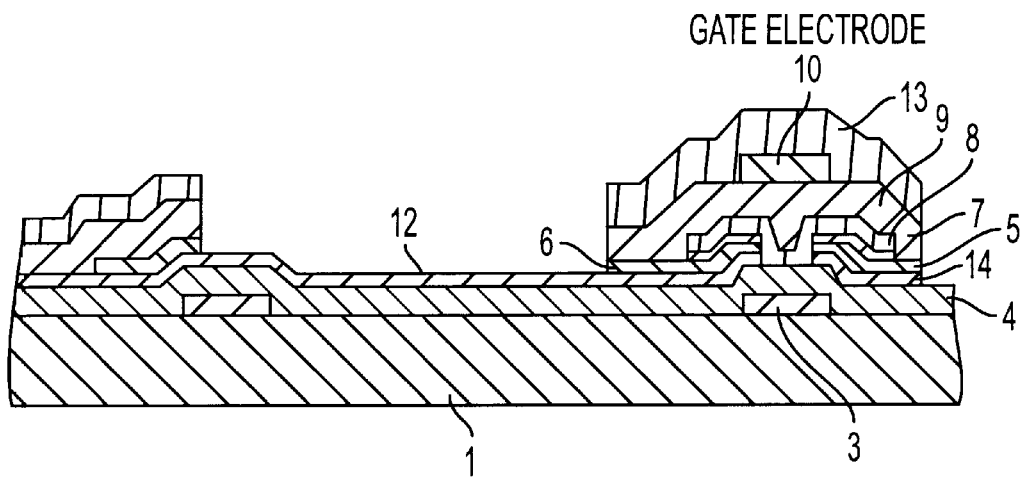
FIG. 5 shows a cross sectional view of a representative conventional TFT element structure.

In the first embodiment, the light shielding film 2 is formed by a light shielding organic film. However, the light shielding film is not restricted to one layer of the light shielding organic film. As shown in FIG. 4, it is possible for example, to laminate a silicon oxide film 15 which is an insulating inorganic film on the light shielding organic layer (it is possible to use a conductive layer). Since the manufacturing steps before the formation of the gate electrode 10 of this embodiment are the same as those of the first embodiment, explanations of those manufacturing steps are omitted.

That is, subsequent to the formation of the gate electrode 10, a silicon nitride film, an amorphous silicon film 8, silicon oxide film, and the light shielding insulating film 2 are subjected to an etching process using $SF_6$ and $O_2$ gases. In this etching process, the Al used for the formation of the gate electrode 10 and the gate signal line 10a and the Cr used for the formation of the source electrode 5, the drain electrode 6 and the drain signal line 6a are not etched by $SF_6$ and $O_2$ gases. Thus, the region in FIG. 1 indicated by the diagonal lines are all etched except the area masked by those metal wires. Explanations are omitted since the subsequent steps are the same as those of the first embodiment.

Third Embodiment

In the first embodiment, a photosensitive acrylic resin is used for forming a transparent smoothening film 11. In contrast, in the third embodiment, various resins such as a non-photosensitive cardo, BCB, or siloxane type fluorine containing resins are used. In particular, when BCB is used, the preprocessing for forming the transparent smoothening film is the same as that of the first embodiment. The coating of BCB is executed by a spin coating apparatus. The BCB film is coated after coating with a coupling agent, in order to enhance the attachment of the BCB film with the underlying film. The coating is executed under a condition of base plate revolutions of 700 ppm to form a film with a thickness of 2.0 μm. After coating, the coated film is prebaked at 150° C. for 5 min., and is fully cured in a baking furnace at 250° C. for 60 min. in nitrogen gas atmosphere. During this fully curing process, the oxygen content in the baking furnace must be less than 100 ppm. After the full curing is completed, a contact hole is formed by successive steps of coating a positive type resist, exposing to the light, developing, and dry etching in a dry etching apparatus. Since BCB is superior in wetting with the resist, no surface treatment is necessary. The dry etching is executed by a plasma etching process under the following conditions.

| | |
|---|---|
| Flow rate of $SF_6$: | 10 sccm |
| Flow rate of $O_2$: | 200 sccm |
| Flow rate of He: | 300 sccm |
| RF power: | 1200 W |
| Pressure: | 130 Pa |
| Distance between electrodes: | 100 mm |
| Temperature: | 20° C. |
| Reaction time: | 180 sec. |

Since the subsequent steps are the same as those of the first embodiments, explanations are omitted.

As described hereinabove, the a-SiTFT active matrix type color LCD is most suitable for the liquid crystal flat display device, and a conventional manufacturing step for forming the light shielding layer of the TFT used for an active switching element can be eliminated. That is, the light shielding layer can be formed using a light insulating film by the dry-etching process of the gate electrode and the a-Si layers simultaneously by the same gases by using the gate electrode and the gate signal line, the source electrode, and the drain electrode and the drain signal lines as masks against etching. This means the reduction in manufacturing steps and in the manufacturing cost for the color LCD system using a liquid crystal flat display device can be achieved.

In addition, the light shielding layer can be produced without causing any misaligning of the gate signal line under the drain signal line, which results in preventing light leakage and in improving the aperture. Consequently, a color LCD with higher light transmittance is provided.

What is claimed is:

1. A semiconductor device of a forward stagger type thin film transistor element (TFT) comprising:
   an insulating substrate;
   a source electrode and a drain electrode formed on an insulating film which is formed on a surface of said insulating substrate;
   an amorphous silicon (a-Si) film and a gate electrode respectively formed on said insulating film in this order; and
   a pixel electrode, wherein said drain electrode is connected to said pixel electrode,
   wherein said insulating film possesses a light shielding property, and the light shielding insulating film formed on said substrate is removed from the surface of the substrate such that the light shielding insulating film covers an area comprising said source electrode, said drain electrode, a drain signal line, said gate electrode, and a gate signal line.

2. A semiconductor device according to claim 1, wherein said light shielding insulating film has a double layer structure formed by laminating an insulating inorganic film on a light shielding organic film.

3. A semiconductor device according to claim 1, wherein said semiconductor device is integrated in an a-SiTFT display device.

4. A semiconductor device according to claim 1, wherein said semiconductor device is integrated in a color liquid crystal display device operated by an a-SiTFT active matrix display system.

5. A color liquid crystal display device according to claim 4, wherein a portion of the semiconductor device without said is smoothened by a transparent smoothening film so as to yield a flat liquid crystal display device.

6. The semiconductor device according to claim 1 having a plurality of a forward stagger type thin film transistor elements.

7. The color liquid display according to claim 4, wherein the pixel electrode is positioned over the transparent smoothening film.

* * * * *

UNITED STATES PATENT AND TRADEMARK OFFICE
CERTIFICATE OF CORRECTION

| | | |
|---|---|---|
| PATENT NO. | : 6,262,436 B1 | Page 1 of 1 |
| APPLICATION NO. | : 09/185640 | |
| DATED | : July 17, 2001 | |
| INVENTOR(S) | : Shinichi Nakata | |

It is certified that error appears in the above-identified patent and that said Letters Patent is hereby corrected as shown below:

Title page under REFERENCES CITED item (56):

Add the following references:
JP09-054342
JP03-209435

Signed and Sealed this

Twenty-eighth Day of June, 2011

David J. Kappos
*Director of the United States Patent and Trademark Office*